United States Patent
Sasamuro et al.

(10) Patent No.: US 9,518,725 B2
(45) Date of Patent: Dec. 13, 2016

(54) LIGHT SOURCE APPARATUS

(71) Applicant: NICHIA CORPORATION, Anan-shi (JP)

(72) Inventors: Takashi Sasamuro, Yamato (JP); Hidenori Matsuo, Hadano (JP)

(73) Assignee: NICHIA CORPORATION, Anan-Shi (JP)

( * ) Notice: Subject to any disclaimer, the term of this patent is extended or adjusted under 35 U.S.C. 154(b) by 63 days.

(21) Appl. No.: 14/567,845

(22) Filed: Dec. 11, 2014

(65) Prior Publication Data
US 2015/0146423 A1 May 28, 2015

Related U.S. Application Data

(62) Division of application No. 13/722,914, filed on Dec. 20, 2012, now Pat. No. 8,944,635.

(30) Foreign Application Priority Data

Dec. 28, 2011 (JP) .................. 2011-289831
May 30, 2012 (JP) .................. 2012-122805
Oct. 9, 2012 (JP) .................. 2012-224306

(51) Int. Cl.
  *F21V 19/00* (2006.01)
  *F21V 29/70* (2015.01)
  *F21K 99/00* (2016.01)
  *H01S 5/024* (2006.01)
  (Continued)

(52) U.S. Cl.
CPC ............... *F21V 29/70* (2015.01); *F21K 9/00* (2013.01); *F21V 5/04* (2013.01); *F21V 21/00* (2013.01);
(Continued)

(58) Field of Classification Search
CPC .......... F21V 5/04; F21V 29/002; F21V 21/00; F21V 29/74; F21V 29/70; F21V 19/00; H01S 5/02288; H01S 5/4025; H01S 5/02; H01S 21/00; H01S 29/74; H01S 5/02469; H01S 5/02212; F21K 9/00; F21Y 2115/00; F21Y 2115/30; F21Y 2101/025
See application file for complete search history.

(56) References Cited

U.S. PATENT DOCUMENTS 9,061,378 B2 * 6/2015 Yoshida .................. B23P 11/00
2007/0115617 A1 5/2007 Schulte et al.
(Continued)

FOREIGN PATENT DOCUMENTS

CN           2667529 Y      12/2004
JP        2005-203663       7/2005
(Continued)

*Primary Examiner* — Bao Q Truong
(74) *Attorney, Agent, or Firm* — Foley & Lardner LLP

(57) ABSTRACT

A light source apparatus is provided which uses a plurality of semiconductor laser devices and which offers adequate heat dissipation. The light source apparatus using a plurality of semiconductor laser devices includes a holding member on which the plurality of semiconductor laser devices is arranged, wherein at least one semiconductor laser device among the plurality of semiconductor laser devices is arranged on the holding member such that a relative position of the semiconductor laser device in an optical axis direction with respect to an adjacent semiconductor laser device in a front view of the holding member is greater than a relative position of the semiconductor laser device in a direction perpendicular to the optical axis direction with respect to the adjacent semiconductor laser device.

11 Claims, 9 Drawing Sheets

(51) Int. Cl.
  *H01S 5/40*   (2006.01)
  *F21V 5/04*   (2006.01)
  *F21V 21/00*  (2006.01)
  *F21V 29/00*  (2015.01)
  *F21V 29/74*  (2015.01)
  *H01S 5/02*   (2006.01)
  *H01S 5/022*  (2006.01)

(52) U.S. Cl.
  CPC ............ *F21V 29/002* (2013.01); *F21V 29/74* (2015.01); *H01S 5/02288* (2013.01); *H01S 5/02469* (2013.01); *H01S 5/4025* (2013.01); *F21Y 2115/30* (2016.08); *H01S 5/02* (2013.01); *H01S 5/02212* (2013.01)

(56) References Cited

U.S. PATENT DOCUMENTS

2010/0091488 A1  4/2010  Ijzerman et al.
2011/0292349 A1  12/2011 Kitano et al.
2012/0206046 A1  8/2012  Huang et al.
2012/0218773 A1* 8/2012  Peiler .................... F21V 31/005
                                                      362/520
2012/0257171 A1  10/2012 Song et al.

FOREIGN PATENT DOCUMENTS

| | | |
|---|---|---|
| JP | 2006-060033 A | 3/2006 |
| JP | 2008-064994 A | 3/2008 |
| JP | 2009-036854 A | 2/2009 |
| JP | 2009-198884 A | 9/2009 |
| JP | 2009-295369 A | 12/2009 |
| JP | 2010-198772 A | 9/2010 |
| JP | 2011-151308 A | 8/2011 |
| JP | 2012-008549  | 1/2012 |
| TW | 2010027868 A1 | 7/2010 |
| WO | WO-2009/090915 A1 | 7/2009 |
| WO | WO-2011/037571 A1 | 3/2011 |

* cited by examiner

FIG. 3A
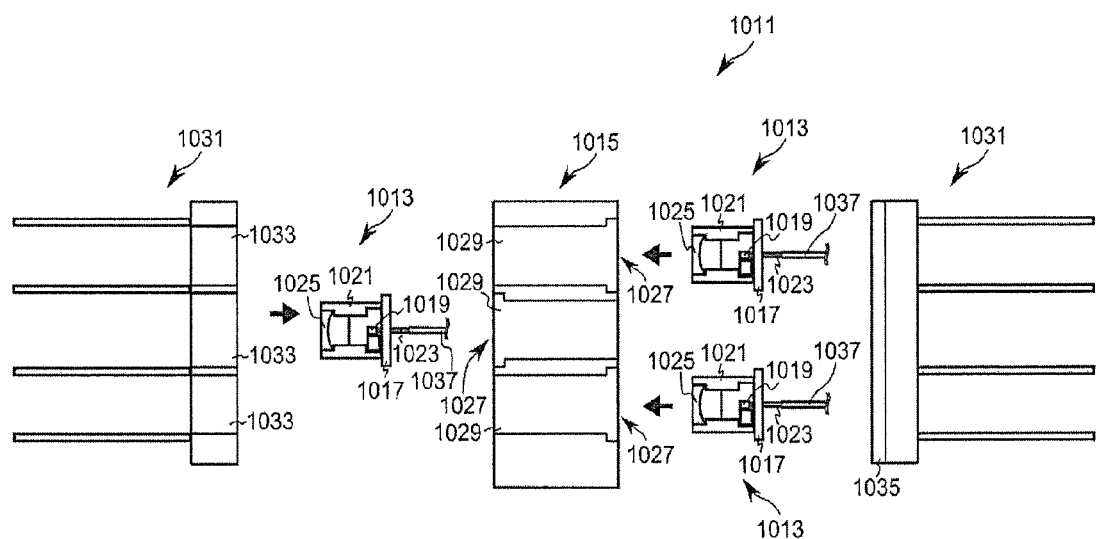
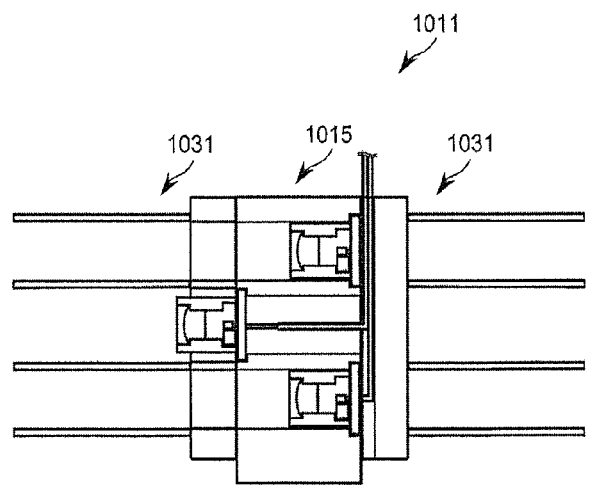
FIG. 3B (a)

LIGHT SOURCE APPARATUS

CROSS REFERENCE TO RELATED APPLICATIONS

This application is a Divisional of and claims priority to U.S. application Ser. No. 13/722,914, filed Dec. 20, 2012 which claims priority to Japanese Application No. 2011-289831, filed Dec. 28, 2011; Japanese Application No. 2012-122805, filed May 30, 2012; and to Japanese Application No. 2012-224306, filed Oct. 9, 2012 the disclosures of which are hereby incorporated by reference in their entirety.

BACKGROUND OF THE INVENTION

1. Field of the Invention

The present invention relates to a light source apparatus and, in particular, to a light source apparatus using a plurality of semiconductor laser devices.

2. Description of the Related Art

Conventionally, a light source apparatus using a plurality of semiconductor laser devices has been proposed (refer to Japanese Patent Application Laid-open No. 2005-203663).

However, problematically, inadequate heat dissipation by the conventional light source apparatus described above causes temperatures of the semiconductor laser device to rise with the passage of operating time and significantly reduces light output.

SUMMARY OF THE INVENTION

In consideration thereof, an object of the present invention is to provide a light source apparatus which uses a plurality of semiconductor laser devices and which offers adequate heat dissipation.

According to the present invention, the problem described above can be solved by the following means.

The present invention is a light source apparatus using a plurality of semiconductor laser devices, the light source apparatus comprising a holding member on which the plurality of semiconductor laser devices is arranged, wherein at least one semiconductor laser device among the plurality of semiconductor laser devices is arranged on the holding member such that a relative position of the semiconductor laser device in an optical axis direction with respect to an adjacent semiconductor laser device in a front view of the holding member is greater than a relative position of the semiconductor laser device in a direction perpendicular to the optical axis direction with respect to the adjacent semiconductor laser device.

In addition, the present invention is the light source apparatus described above, wherein the semiconductor laser device is a collimator lens-integrated semiconductor laser device.

Furthermore, the present invention is the light source apparatus described above, wherein depressions are respectively provided on a front face and a rear face of the holding member and each of the plurality of semiconductor laser devices is arranged in the depression.

Moreover, the present invention is the light source apparatus described above, wherein at least one of the depressions is formed such that an inner diameter thereof corresponds to an outer diameter of each of the semiconductor laser devices.

In addition, the present invention is the light source apparatus described above, wherein at least one of the depressions is formed such that a depth thereof corresponds to a thickness of each of the semiconductor laser devices.

Furthermore, the present invention is the light source apparatus described above, wherein a radiating member is attached to at least one of the front face and the rear face of the holding member.

Moreover, the present invention is the light source apparatus described above, wherein the semiconductor laser device has a stem, and the radiating member abuts on the stem of the semiconductor laser device.

In addition, the present invention is the light source apparatus described above, wherein the semiconductor laser device is held by the holding member due to the stem being pressed down by the radiating member.

According to the present invention, a light source apparatus can be provided which uses a plurality of semiconductor laser devices and which offers adequate heat dissipation.

BRIEF DESCRIPTION OF THE DRAWINGS

FIGS. 3A and 3B are schematic sectional views (a section taken along line A-A in FIG. 1) of a light source apparatus according to the first embodiment of the present invention, FIG. 3A showing the light source apparatus prior to attaching various members to a holding member, and FIG. 3B showing the light source apparatus after the various members have been attached to the holding member;

FIG. 4A AND 4B are schematic views showing relative positions of two semiconductor laser devices, wherein FIG. 4A is a diagram showing a case where optical axis directions of the two semiconductor laser devices are parallel to each other and FIG. 4B is a diagram showing a case where the optical axis directions are not parallel to each other;

DESCRIPTION OF THE PREFERRED EMBODIMENTS

Hereinafter, embodiments of the present invention will be described with reference to the accompanying drawings.

<First Embodiment>

Figure 1:
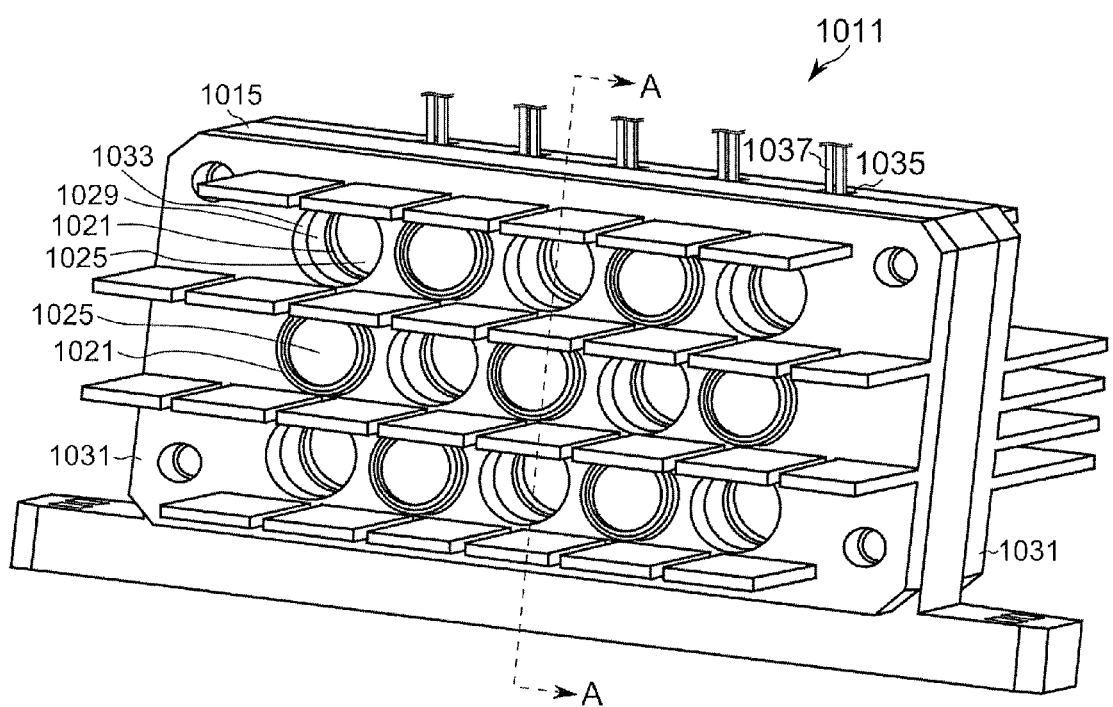
FIG. 1 is a schematic front perspective view of a light source apparatus according to a first embodiment of the present invention.
Figure 2:
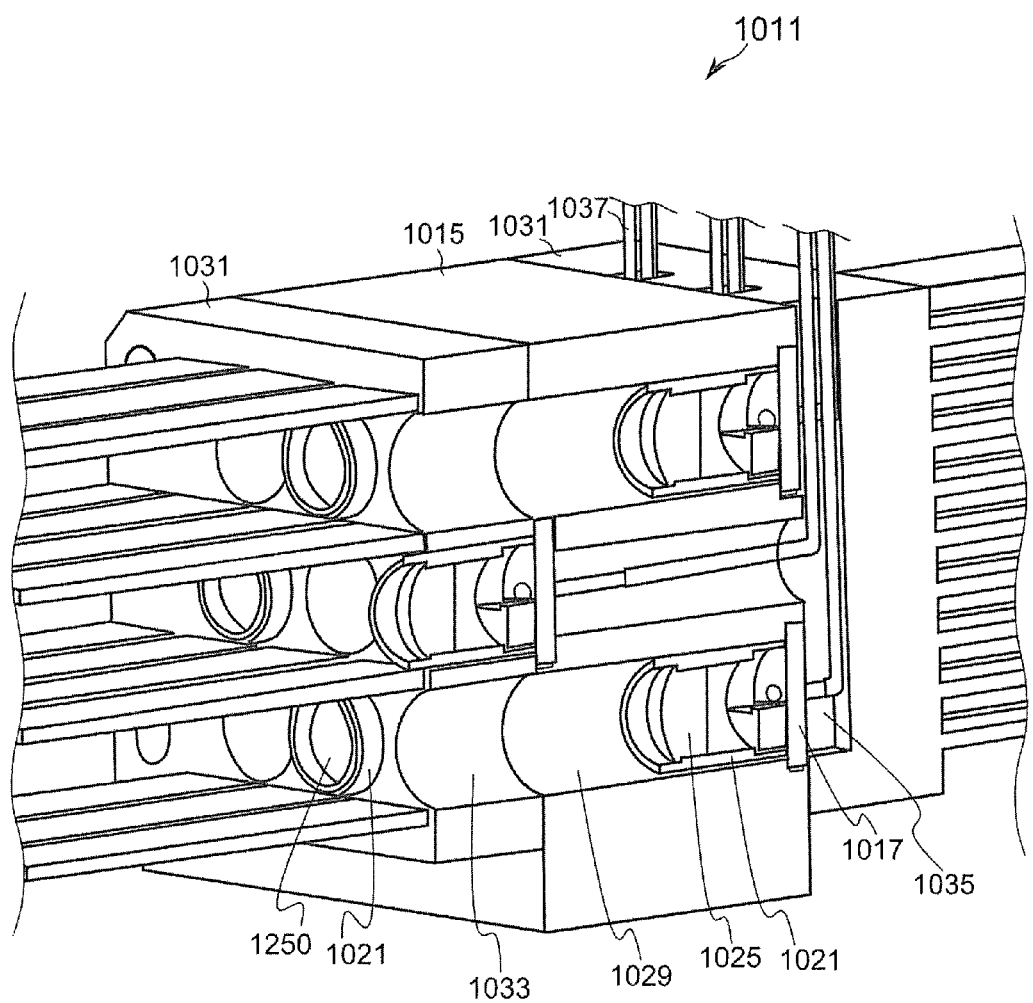
FIG. 2 is a schematic sectional perspective view (a section taken along line A-A in FIG. 1) of a light source apparatus according to the first embodiment of the present invention.

FIG. 1 is a schematic front perspective view of a light source apparatus according to a first embodiment of the present invention, and FIG. 2 is a schematic sectional perspective view (a section taken along line A-A in FIG. 1) of the light source apparatus according to the first embodiment of the present invention. In addition, FIG. 3 is a schematic sectional view (a section taken along line A-A in FIG. 1) of the light source apparatus according to the first embodiment of the present invention, wherein FIG. 3A is a schematic diagram showing the light source apparatus prior to attaching various members to a holding member, and FIG. 3B is a schematic diagram showing the light source apparatus after the various members have been attached to the holding member.

As shown in FIGS. 1 to 3, a light source apparatus 1011 according to the first embodiment of the present invention is a light source apparatus 1011 using a plurality of semiconductor laser devices 1013, and comprises the plurality of semiconductor laser devices 1013 and a holding member 1015 on which the plurality of semiconductor laser devices 1013 is arranged.

The plurality of semiconductor laser devices 1013 is arranged on the holding member 1015 such that a relative position in an optical axis direction with respect to an adjacent semiconductor laser device 1013 in a front view of the holding member 1015 is greater than a relative position in a direction perpendicular to the optical axis direction with respect to the adjacent semiconductor laser device 1013.

The "optical axis direction" refers to a direction parallel to an optical axis of a semiconductor laser device picked up in order to measure a relative position with respect to an adjacent semiconductor laser device. An optical axis of a semiconductor laser device can be defined as an axis perpendicular to a light-emitting end face of a semiconductor laser element included in the semiconductor laser device.

Figure 4A:
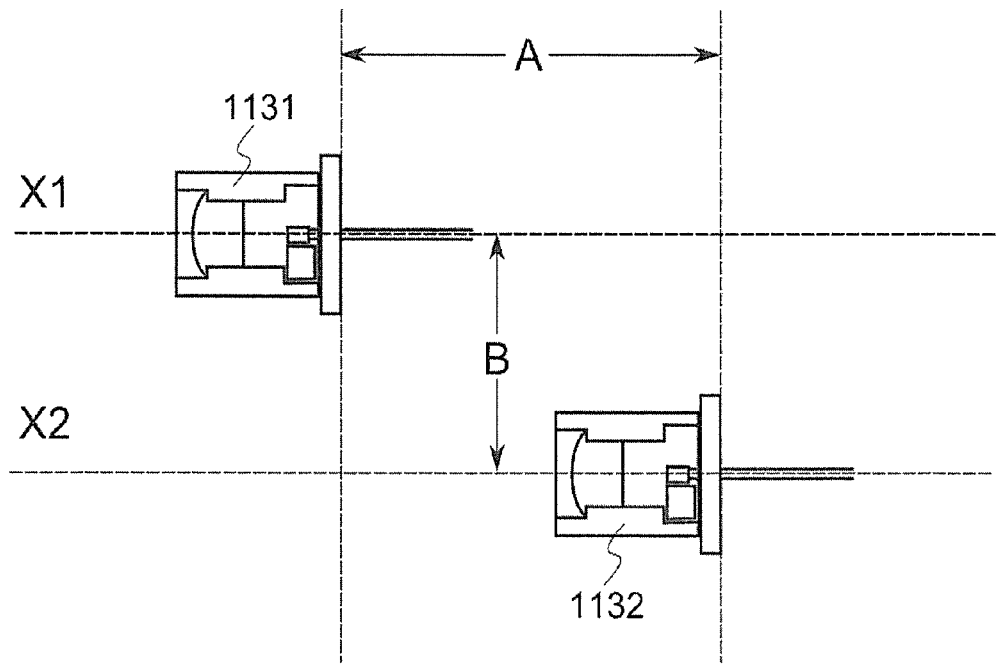
Figure 4B:
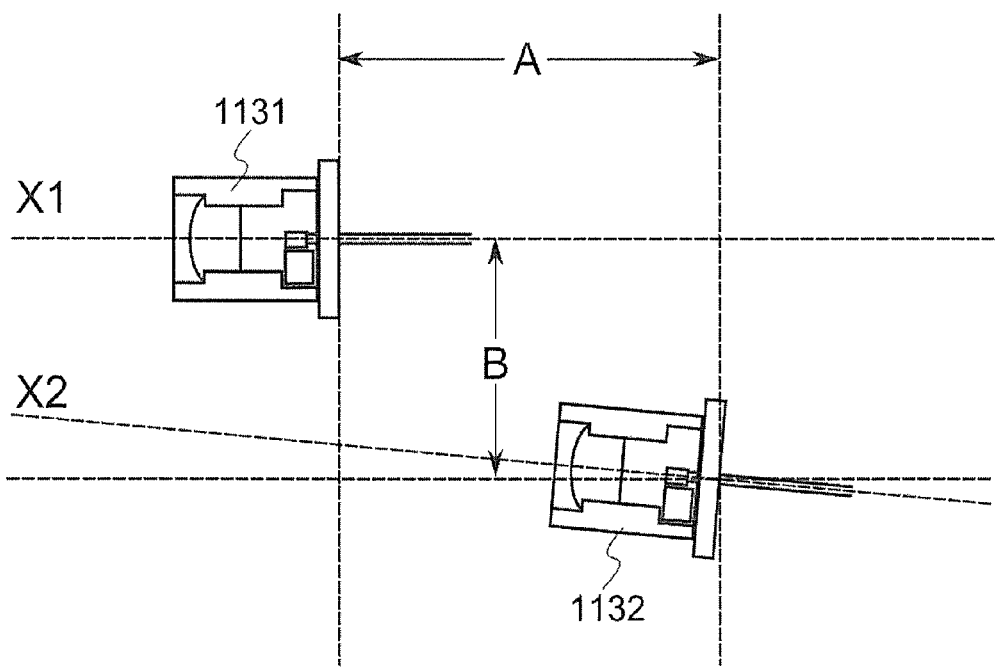

FIG. 4 is a schematic view describing relative positions of two semiconductor laser devices, wherein FIG. 4A is a diagram showing a case where optical axis directions of the two semiconductor laser devices are parallel to each other and FIG. 4B is a diagram showing a case where the optical axis directions are not parallel to each other.

First, a case where the optical axis directions of the two semiconductor laser devices are parallel to each other will be described.

In FIG. 4A, a semiconductor laser device 1131 and a semiconductor laser device 1132 are in an adjacent relationship in a front view of the holding member 1015. An optical axis direction X1 of the semiconductor laser device 1131 and an optical axis direction X2 of the semiconductor laser device 1132 are parallel to each other.

A relative position of the semiconductor laser device 1131 with respect to the semiconductor laser device 1132 in the optical axis direction X1 (the optical axis direction of the semiconductor laser device 1131) is denoted by A. In addition, a relative position of the semiconductor laser device 1131 with respect to the semiconductor laser device 1132 in a direction perpendicular to the optical axis direction X1 (the optical axis direction of the semiconductor laser device 1131) is denoted by B.

Next, a case where the optical axis directions of the two semiconductor laser devices are not parallel to each other will be described.

In FIG. 4B, the semiconductor laser device 1131 and the semiconductor laser device 1132 are in an adjacent relationship in the front view of the holding member 1015. The optical axis direction X1 of the semiconductor laser device 1131 and the optical axis direction X2 of the semiconductor laser device 1132 are not parallel to each other.

A relative position of the semiconductor laser device 1131 with respect to the semiconductor laser device 1132 in the optical axis direction X1 (the optical axis direction of the semiconductor laser device 1131) is denoted by A. In addition, a relative position of the semiconductor laser device 1131 with respect to the semiconductor laser device 1132 in a direction perpendicular to the optical axis direction X1 (the optical axis direction of the semiconductor laser device 1131) is denoted by B.

While a case where the optical axis directions of two semiconductor laser devices are parallel to each other and a case where the optical axis directions are not parallel to each other have been described above, in the first embodiment of the present invention, the semiconductor laser device 1131 is arranged on the holding member 1015 in both of the cases such that the relative position A is greater than the relative position B with respect to the semiconductor laser device 1132.

Moreover, while a mode in which relative positions A and B of a semiconductor laser device are obtained with reference to a center of a bottom face of a stem of the semiconductor laser device has been described in the first embodiment of the present invention, the present invention also includes modes where a relative position of a semiconductor laser device is obtained with reference to other locations.

While the light source apparatus 1011 according to the first embodiment of the present invention has been heretofore described, with the light source apparatus 1011 according to the first embodiment of the present invention, since the plurality of semiconductor laser devices 1013 is densely arranged in a direction perpendicular to a direction in which light is emitted from the light source apparatus 1011 but sparsely arranged in the direction in which light is emitted from the light source apparatus 1011, heat generated by the semiconductor laser devices 1013 can be efficiently released to the outside. Consequently, the light source apparatus 1011 which uses the plurality of semiconductor laser devices 1013 and which offers adequate heat dissipation can be provided.

Moreover, while a description has been given above on a mode in which all of the plurality of semiconductor laser devices 1013 are arranged according to the relative positions described earlier, the present invention also includes modes in which at least one of the plurality of semiconductor laser devices 1013 is arranged according to the relative positions described earlier.

A more detailed description will now be given.

[Semiconductor Laser Device]

The semiconductor laser device 1013 comprises a stem 1017, a semiconductor laser element 1019 mounted on the stem 1017, a cap 1021 which seals the semiconductor laser element 1019, and a lead pin 1023.

A semiconductor laser element with any emission wavelength (emission color) such as visible light, ultraviolet light, and infrared light can be selected as the semiconductor laser element 1019. For example, semiconductor laser elements capable of emitting ultraviolet light or visible light such as blue light and green light include semiconductor laser elements using a II-IV compound semiconductor (such as ZnSe), a nitride semiconductor ($In_XAl_YGa_{1-X-Y}N$, $0 \leq X$, $0 \leq Y$, $X+Y \leq 1$), or GaP. In addition, semiconductor laser elements capable of emitting red light include semiconductor laser elements using GaAlAs, AlInGaP, or the like. Furthermore, semiconductor laser elements made of materials other than those mentioned above can also be used, and an emission wavelength, the number of semiconductor laser elements, and the like can be selected as appropriate depending on objectives and applications.

Moreover, as will be described later, the semiconductor laser device 1013 according to the first embodiment of the present invention is a collimator lens-integrated semiconductor laser device 1013 which includes a collimator lens 1025 in the cap 1021. The collimator lens-integrated semiconductor laser device 1013 is an example of the semiconductor laser device 1013 capable of emitting parallel light.

[Collimator Lens]

The collimator lens 1025 is an example of a member which converts light emitted from the semiconductor laser element 1019 into parallel light.

Due to the use of a member which converts light emitted from the semiconductor laser element 1019 into parallel light such as the collimator lens 1025, light emitted from the semiconductor laser element 1019 can be converted into parallel light and light loss at surrounding members (inner walls of through holes 1029 and 1033 to be described later) or the like can be suppressed. As a result, the semiconductor laser device 1013 can be more easily displaced in the optical axis direction.

In the first embodiment of the present invention, the collimator lens 1025 is included in the cap 1021 of the semiconductor laser device 1013. Therefore, since an adjusting device (such as a device for adjusting relative positions between the semiconductor laser device 1013 and the collimator lens 1025) need not be installed and means for holding the collimator lens 1025 also need not be provided on the holding member 1015 or the like, the plurality of semiconductor laser devices 1013 can be readily arranged at a predetermined arrangement position.

For example, a lens made of a glass material such as BK7 can be used as the collimator lens 1025.

[Holding Member]

For example, a metallic material such as aluminum, copper, and stainless steel can be used as the holding member 1015.

Depressions 1027 are respectively provided on a front face and a rear face of the holding member 1015 and the plurality of semiconductor laser devices 1013 is respectively arranged at the depressions 1027. More specifically, a plurality of through holes 1029 is provided in the holding member 1015 and the depressions 1027 are formed at ends of the through holes 1029.

The lead pin 1023 of the semiconductor laser device 1013 arranged at the depression 1027 on the front face of the holding member 1015 is inserted through a through hole 1029. The cap 1021 of the semiconductor laser device 1013 arranged at the depression 1027 on the rear face of the holding member 1015 is inserted through a through hole 1029.

The depression 1027 is formed such that an inner diameter thereof is approximately equal to an outer diameter of the stem 1017 (an example of a mode in which the inner diameter of the depression 1027 is formed in correspondence with an outer diameter of the semiconductor laser device 1013). Therefore, with the depression 1027 formed on the front face of the holding member 1015, a bottom face of the depression 1027 abuts a rear face of the stem 1017 of the semiconductor laser device 1013 or, more preferably, the bottom face and a side face of the depression 1027 respectively abut a rear face and a side face of the stem 1017 of the semiconductor laser device 1013. In addition, with the depression 1027 formed on the rear face of the holding member 1015, a bottom face of the depression 1027 abuts a front face of the stem 1017 of the semiconductor laser device 1013 or, more preferably, the bottom face and a side face of the depression 1027 respectively abut a front face and a side surface of the stem 1017 of the semiconductor laser device 1013.

In addition, the depression 1027 is formed such that a depth thereof is approximately equal to a thickness of the stem 1017 (an example of a mode in which the depth of the depression 1027 is formed in correspondence with a thickness of the semiconductor laser device 1013). Therefore, the stem 1017 of the semiconductor laser device 1013 is housed in the depression 1027 so as to fit snugly. Meanwhile, at the holding member 1015, a surface of the stem 1017 housed in the depression 1027 abuts a radiating member 1031, and on the rear face of the holding member 1015, the rear face of the stem 1017 housed in the depression 1027 abuts the radiating member 1031. Moreover, for example, when the stem 1017 has a disc-like base portion, an element mounting portion, or the like, a thickness of the disc-like base portion is assumed to be an example of the thickness of the stem 1017.

As shown, in the first embodiment of the present invention, by abutting the stem 1017 of the semiconductor laser device 1013 against the depression 1027 or the radiating member 1031, an area of contact between the semiconductor laser device 1013 and the holding member 1015 or the radiating member 1031 can be increased and heat generated at the semiconductor laser device 1013 can be released to the outside in an efficient manner.

Moreover, while an example of a mode in which all depressions 1027 are formed such that inner diameters thereof correspond to outer diameters of the semiconductor laser devices 1013 has been described in the first embodiment of the present invention, the present invention also includes a mode in which at least one depression 1027 is formed such that the inner diameter thereof corresponds to an outer diameter of the semiconductor laser device 1013.

Moreover, while an example of a mode in which all depressions 1027 are formed such that depths thereof correspond to thicknesses of the semiconductor laser devices 1013 has been described in the first embodiment of the present invention, the present invention also includes a mode in which at least one depression 1027 is formed such that the depth thereof corresponds to a thickness of the semiconductor laser device 1013.

[Radiating Member]

A radiating member 1031 is respectively attached to the front face and the rear face of the holding member 1015 by means such as fastening with screws or adhesion with an adhesive. For example, a metallic material such as aluminum, copper, and stainless steel can be used as the radiating member 1031. The radiating member 1031 has a plurality of fins.

A dissipating resin or the like can be applied between the radiating member 1031 and the holding member 1015. Accordingly, heat generated at the semiconductor laser device 1013 can be released to the outside even more efficiently.

The radiating member 1031 pins down the stem 1017 of the semiconductor laser device 1013. The semiconductor laser device 1013 is held by the holding member 1015 due to the stem 1017 of the semiconductor laser device 1013 being pinned down by the radiating member 1031.

A through hole 1033 is provided in the radiating member 1031 attached to the front face of the holding member 1015. The through hole 1033 is formed so as to lead to the through hole 1029 provided in the holding member 1015. The cap 1021 of the semiconductor laser device 1013 arranged at the depression 1027 on the front face of the holding member 1015 is inserted through the through hole 1033.

Emitted light from the semiconductor laser device 1013 arranged at the depression 1027 on the front face of the holding member 1015 passes through the through hole 1033 provided in the radiating member 1031 and is emitted from the front face of the light source apparatus 1011. Emitted light from the semiconductor laser device 1013 arranged at the depression 1027 on the rear face of the holding member 1015 passes through the through hole 1029 provided in the holding member 1015 and the through hole 1033 provided in the radiating member 1031, and is emitted from the front face of the light source apparatus 1011.

A groove 1035 is provided on the radiating member 1031 to be attached to the rear face of the holding member 1015. A flexible cable 1037 to be connected to the lead pin 1023 of the semiconductor laser device 1013 or the like is passed through the groove 1035.

Moreover, while an example of a mode in which radiating members 1031 are respectively attached to the front face and the rear face of the holding member 1015 has been described in the first embodiment of the present invention, the present invention also includes a mode in which the radiating member 1031 is attached to at least one of the front face and the rear face of the holding member 1015.

[Other]

Moreover, although not particularly shown in the drawings, the light source apparatus 1011 according to the first embodiment of the present invention can be further provided with a condenser lens which couples and emits light emitted from the plurality of semiconductor laser devices 1013 or the like.

<Second Embodiment>

Figure 5:
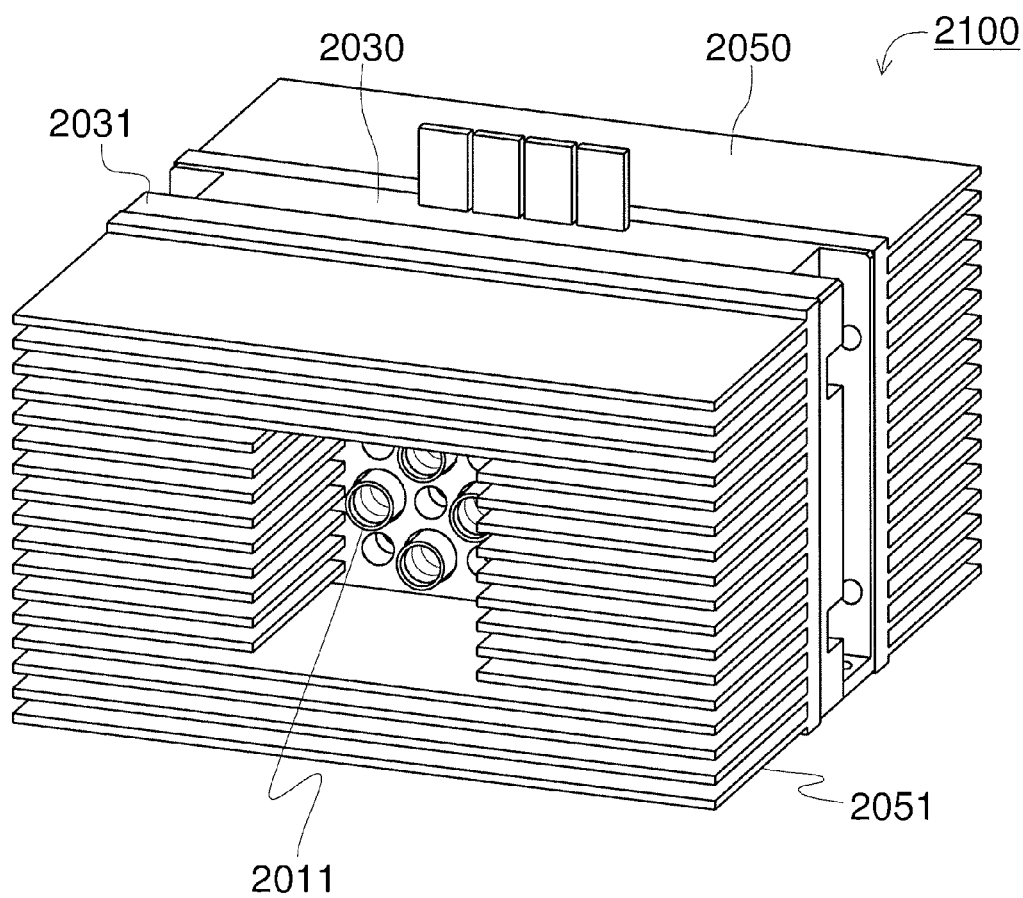
FIG. 5 is a schematic perspective view showing an exterior of a light source apparatus according to a second embodiment of the present invention.
Figure 6:
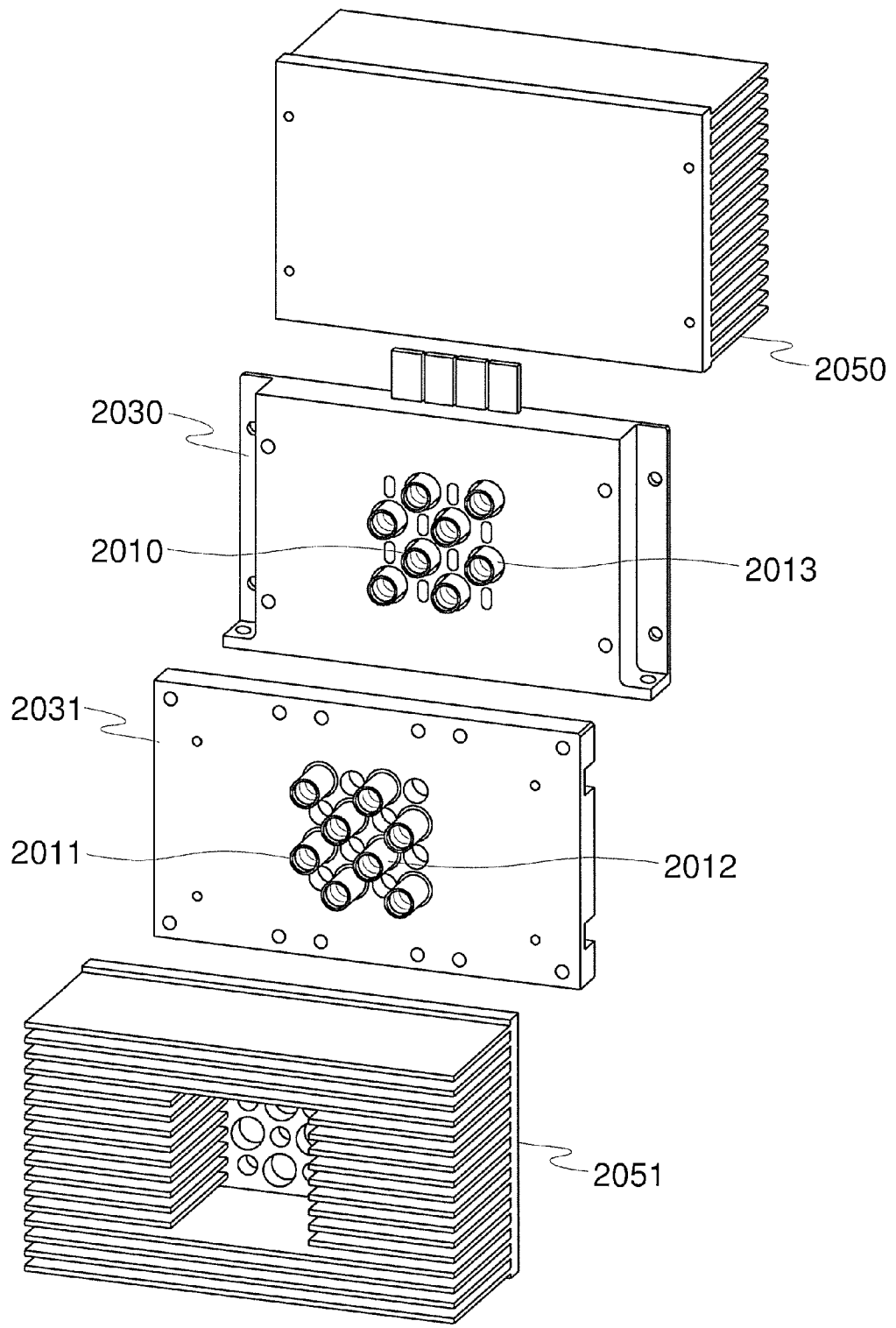
FIG. 6 is a schematic perspective view showing a construction of a light source apparatus according to the second embodiment of the present invention.
Figure 7A:
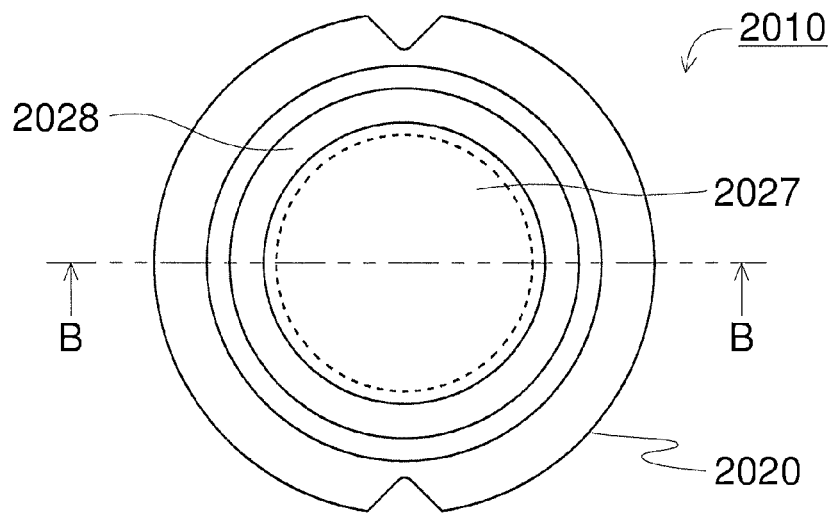
FIG. 7A is a schematic top view showing a semiconductor laser device according to the second embodiment of the present invention.
Figure 7B:
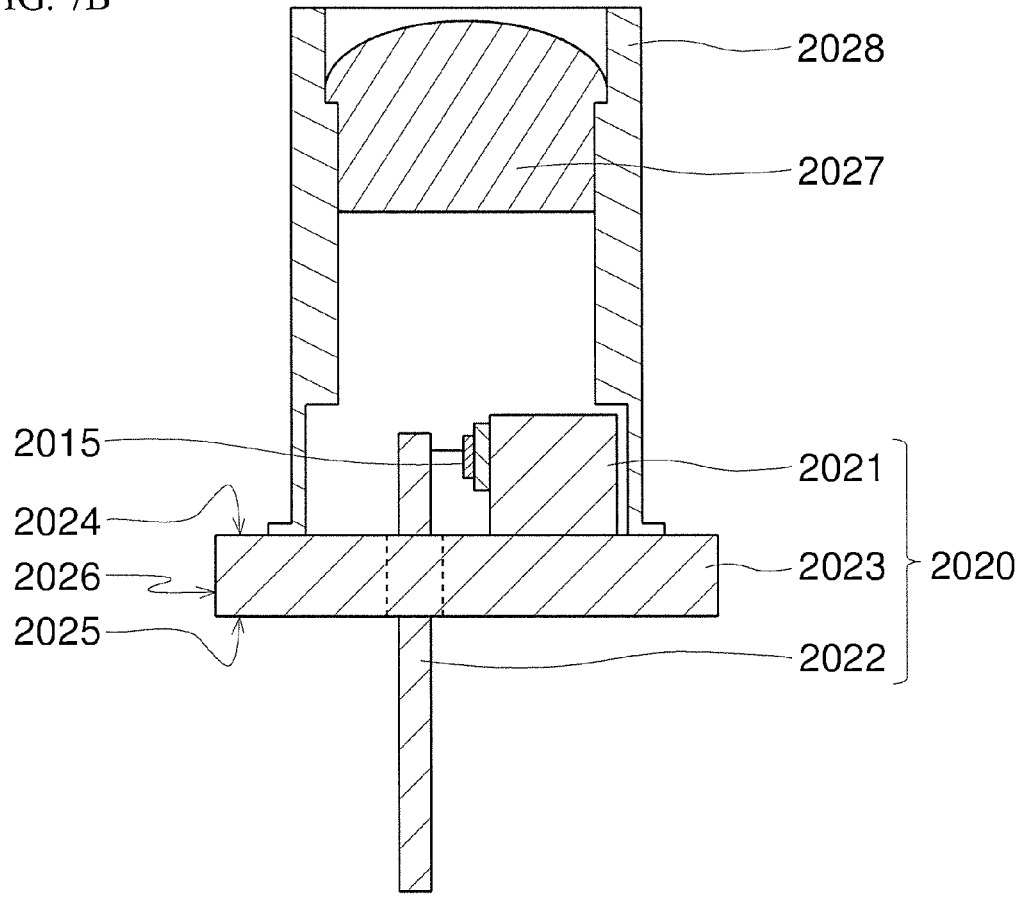
FIG. 7B is a schematic sectional view showing a section of the semiconductor laser device taken along line B-B in FIG. 7A.
Figure 8A:
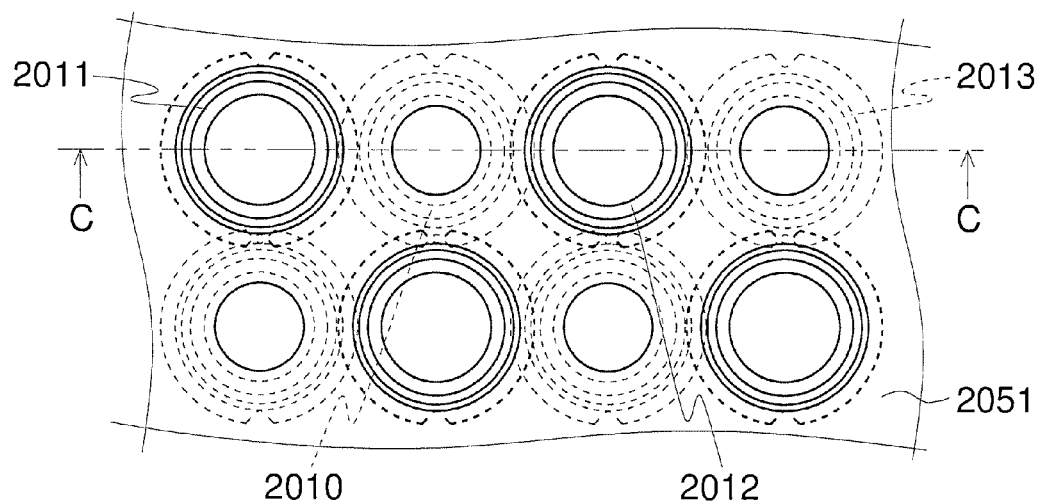
FIG. 8A is a schematic top view showing an enlargement of a structure of a part of a light source apparatus according to the second embodiment of the present invention.
Figure 8B:
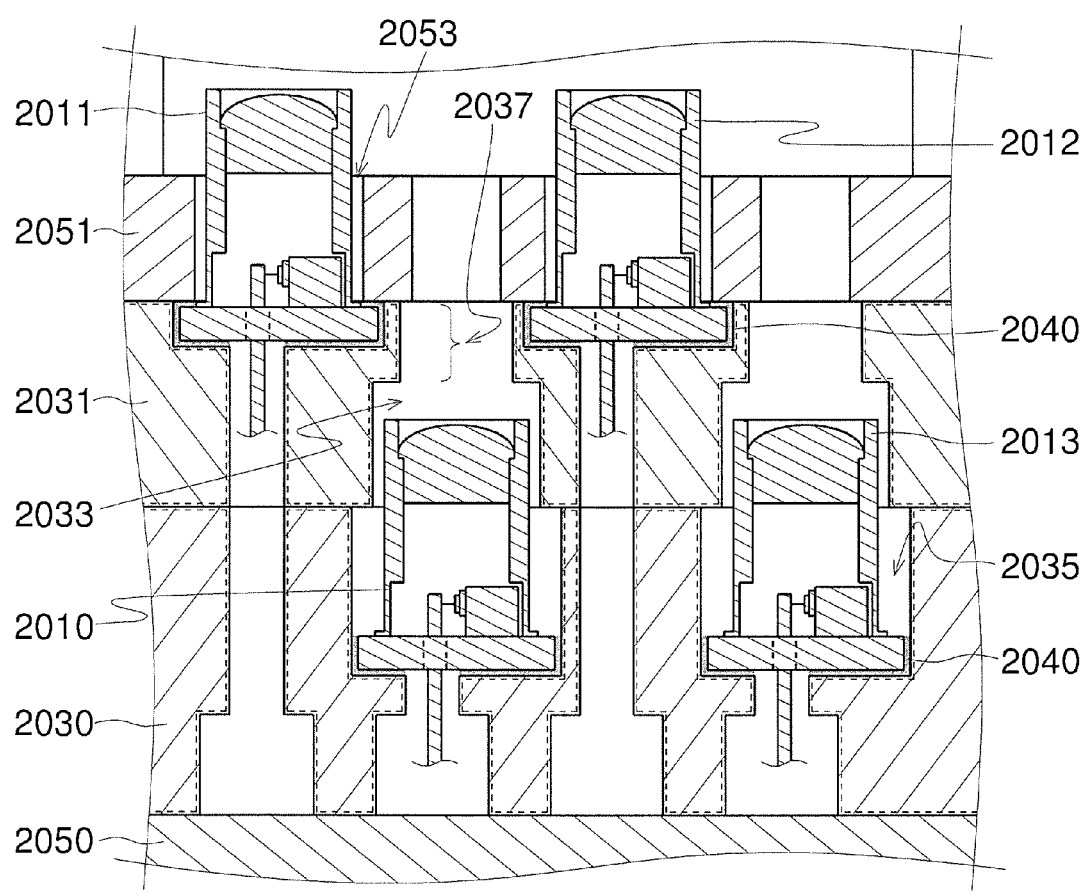
FIG. 8B is a schematic sectional view showing a section of the partial structure taken along line C-C in FIG. 8A.

FIGS. 5 and 6 are schematic perspective views respectively showing an exterior and a construction of a light source apparatus according to a second embodiment of the present invention. FIG. 7A is a schematic top view showing a semiconductor laser device according to the second embodiment, and FIG. 7B is a schematic sectional view showing a section taken along line B-B in FIG. 7A. FIG. 8A is a schematic top view showing an enlargement of a structure of a part of a light source apparatus according to the second embodiment, and FIG. 8B is a schematic sectional view showing a section taken along line C-C in FIG. 8A.

Hereinafter, in a direction along an optical axis (an optical axis direction) of the light source apparatus, typically, a side from which light is emitted will be referred to as front, an opposite side thereof will be referred to as rear, and a direction perpendicular to the optical axis will be referred as a lateral direction. In addition, typically, at each member, a side corresponding to the front of the light source apparatus will be referred to as above and a side corresponding to the rear of the light source apparatus will be referred to as below.

As shown in FIGS. 5 and 6, a light source apparatus 2100 according to the second embodiment is typically constructed such that a second holding member 2031 is provided on a first holding member 2030, the first holding member 2030 and the second holding member 2031 respectively holding pluralities of semiconductor laser devices, and a first radiating member 2050 and a second radiating member 2051 are connected to the front and the rear of the first holding member 2030 and the second holding member 2031. Due to the first radiating member 2050 and the second radiating member 2051 being respectively provided on the side of the first holding member 2030 and the second holding member 2031, heat can be drawn in a dispersed manner from the respective holding members 2030 and 2031. Therefore, radiation performances of the semiconductor laser devices can be readily improved. In addition, consequently, the light source apparatus can be readily downsized.

Moreover, the respective holding members 2030 and 2031 need only hold at least one semiconductor laser device. In addition, while having two holding members is favorable from the perspective of radiation performances of the semiconductor laser devices and downsizing of the light source apparatus, there may be three or more holding members. Furthermore, besides a mode in which the holding members 2030 and 2031, as well as the holding members 2030, 2031 and the radiating members 2050, 2051, are provided in contact with each other, other members such as a thermal grease, a thermal dissipation sheet, and an adhesive may be interposed between the holding members 2030 and 2031 as well as between the holding members 2030, 2031 and the radiating members 2050, 2051.

As shown in FIGS. 7A and 7B, each semiconductor laser device has a stem 2020. The stem 2020 comprises an element mounting portion 2021 on which a semiconductor laser element 2015 is mounted, a terminal 2022 electrically connected to the semiconductor laser element 2015, and a base portion 2023 which holds the element mounting portion 2021 on a side of an upper face 2024 and which holds the terminal 2022 by exposing the terminal on a side of a lower face 2025. Moreover, the base portion 2023 may alternatively integrally hold the element mounting portion 2021.

As shown in FIGS. 8A and 8B, it is assumed that one of the semiconductor laser devices held by the first holding member 2030 is a first semiconductor laser device 2010. It is also assumed that one of the semiconductor laser devices held by the second holding member 2031 is a second semiconductor laser device 2011. Furthermore, it is assumed that one of the semiconductor laser devices held by the second holding member 2031 so as to be separated from the second semiconductor laser device 2011 is a third semiconductor laser device 2012. It is further assumed that one of the semiconductor laser devices held by the first holding member 2030 so as to be separated from the first semiconductor laser device 2010 is a fourth semiconductor laser device 2013. Moreover, the respective semiconductor laser devices are fixed to the holding members 2030 and 2031 by press fitting into depressions 3035 (to be described later), adhesion by an adhesive member such as will be described later, welding, or the like.

In addition, as shown in FIGS. 8A and 8B, the second holding member 2031 has a window portion 2033 through which light from the first semiconductor laser device 2010 is emitted, and light emitted from the first semiconductor laser device 2010 can be efficiently extracted to the outside of the light source apparatus. The window portion 2033 is provided in correspondence with all semiconductor laser devices held by the first holding member 2030. Moreover, while the "window portion" is typically a through hole, any region may be used as long as light emitted from each semiconductor laser device can be transmitted and extracted to the outside of the light source apparatus. For example, a translucent member such as resin or glass may be provided at the window portion. In addition, the translucent member may be provided in contact with a semiconductor laser device inserted into the window portion.

Furthermore, as shown in FIGS. 8A and 8B, the second holding member 2031 holds the second semiconductor laser device 2011 such that the second semiconductor laser device 2011 overlaps a part of the first semiconductor laser device 2010 when viewed from a light-emitting side (in other words, from the front or above). In other words, this refers to a state where, when viewed from the front, a part of the first semiconductor laser device 2010 is positioned directly behind a part of the second semiconductor laser device 2011. Moreover, in this case, the region that is apparently overlapped when viewed from the light-emitting side is typically a region that constitutes an outermost shell in a lateral direction of the semiconductor laser device. In the present example, this region is the stem 2020 and, more specifically, the base portion 2023 thereof.

As shown, the light source apparatus 2100 according to the second embodiment is constructed such that a holding member which holds semiconductor laser devices is divided into a plurality of members 2030 and 2031 each holding semiconductor laser devices 2010 and 2011, and the plurality of members 2030 and 2031 overlap each other. Accordingly, an interval in the lateral direction between the semiconductor laser devices 2010 and 2011 can be readily set shorter than widths of the semiconductor laser devices 2010 and 2011 in the lateral direction. Therefore, the plurality of semiconductor laser devices 2010 and 2011 can be densely arranged in the lateral direction and downsizing of the light source apparatus can be achieved. In addition, since the first semiconductor laser device 2010 and the second semiconductor laser device 2011 are held separated from each other in the optical axis direction, high radiation performance of the respective semiconductor laser devices 2010 and 2011 can be secured. In many cases, an interval in the optical axis direction between the first semiconductor laser device 2010 and the second semiconductor laser device 2011 is greater than the interval in the lateral direction between the semiconductor laser devices. In other words, the plurality of semiconductor laser devices 2010 and 2011 can be arranged in a positional relationship in which the semiconductor laser devices are densely arranged in the lateral direction and sparsely arranged in the optical axis direction. Therefore, since spreading of light emitted from the light source apparatus 2100 can be suppressed, downsizing of an optical system arranged in front of the light source apparatus can be achieved.

A preferable construction of the light source apparatus 2100 will be described below.

As shown in FIG. 8B, the first holding member 2030 and the second holding member 2031 respectively comprise depressions 3035. In addition, at least a part of the stem 2020 of the first semiconductor laser device 2010 is housed inside the depression 3035. Similarly, at least a part of the stem 2020 of the second semiconductor laser device 2011 is housed inside the depression 3035. Accordingly, areas of contact between the semiconductor laser devices 2010 and 2011 and the holding members 2030 and 2031 can be readily increased and radiation performances of the semiconductor laser devices 2010 and 2011 can be readily improved. Moreover, while the depression 3035 need be capable of housing at least a part of the base portion 2023 of the stem 2020 of a semiconductor laser device, the depression 3035 preferably houses all of the base portion 2023 of the stem in order to cause heat generated from the semiconductor laser devices 2010 and 2011 to be conducted more efficiently by the holding members 2030 and 2031. Furthermore, the depression 3035 may house all of the base portion 2023 of the stem of a semiconductor laser device and a cap 2028. In addition, preferably, a shape of the depression 3035 approximately conforms to a shape of the base portion 2023 of the stem to enable the semiconductor laser device 2010 to be installed accurately. A bottom face of the depression 3035 is favorably a flat surface. While a side face of the depression 3035 may be approximately perpendicular with respect to the bottom face, the side face may alternatively be an inclined face (for example, with an angle of inclination of 5 degrees or more and 45 degrees or less) with a large upper-side opening diameter. Depths of the respective depressions 3035 on a single holding member may be approximately the same or may differ among one another. Moreover, the depressions 3035 are not essential components of the holding members 2030 and 2031. Alternatively, the holding members 2030 and 2031 may hold semiconductor laser devices in a mode where the semiconductor laser devices are mounted on flat upper faces of the holding members.

As shown in FIG. 8B, a part of the first semiconductor laser device 2010 is inserted into the window portion 2033 of the second holding member 2031. Accordingly, the first semiconductor laser device 2010 can be more readily held close to the second holding member 2031 and the light source apparatus can be readily downsized. In addition, heat generated from the first semiconductor laser device 2010 can be more readily conducted to the second holding member 2031 and, by extension, to the second radiating member 2051, and the radiation performance of the first semiconductor laser device 2010 can be readily improved. Moreover, while a region of the first semiconductor laser device 2010 inserted into the window portion 2033 of the second holding member is typically a part of the cap 2028, the inserted region may also include the base portion 2023 of the stem and, by extension, the entire first semiconductor laser device 2010.

As shown in FIG. 8B, the window portion 2033 of the second holding member 2031 includes a narrow width portion 2037 whose width is narrower than a width of the first semiconductor laser device 2010. With a construction in which the second holding member 2031 is provided on top of the first holding member 2030, the first semiconductor laser device 2010 can be installed on the first holding member 2030 without having to pass the first semiconductor laser device 2010 through the window portion 2033 of the second holding member 2031. Therefore, the narrow width portion 2037 can be provided in the window portion 2033. As a result, since a heat capacity of the second holding member 2031 can be readily maintained at a high level, heat generated from the semiconductor laser devices 2010 and 2011 can be more readily conducted to the second holding member 2031 and, by extension, to the second radiating member 2051, and the radiation performance of the semiconductor laser devices 2010 and 2011 can be readily improved. The narrow width portion 2037 may be a part of the window portion 2033 or the entire window portion 2033. Moreover, the term "width" as used here may be rephrased as "diameter", and refers to a size in a lateral direction and typically a maximum value thereof.

As shown in FIGS. 8A and 8B, the light source apparatus 2100 comprises the second radiating member 2051 connected to the second holding member 2031. The second radiating member 2051 has a window portion 2053 and is capable of extracting light emitted from the second semiconductor laser device 2011 to the outside of the light source apparatus in an efficient manner. In addition, a part of the second semiconductor laser device 2011 is inserted into the window portion 2053 of the second radiating member. Accordingly, the second semiconductor laser device 2011 can be more readily held close to the second radiating member 2051 and the light source apparatus can be readily downsized. In addition, heat generated from the second semiconductor laser device 2011 can be more readily conducted to the second radiating member 2051, and the radiation performance of the second semiconductor laser device 2011 can be readily improved. Moreover, while a region of the second semiconductor laser device 2011 inserted into the window portion 2053 of the second radiating member is typically a part of the cap 2028, the inserted region may also include the base portion 2023 of the stem and, by extension, the entire second semiconductor laser device 2011. In addition, the window portion 2053 is provided in correspondence with all semiconductor laser devices held by the second holding member 2031. Furthermore, the second radiating member 2051 also has another window portion which is provided in correspondence with all semiconductor laser devices held by the first holding member 2030.

As shown in FIG. 8B, the light source apparatus 2100 comprises an adhesive member 2040 provided in correspondence with each semiconductor laser device. In addition, a lower face 2025 of the base portion 2023 of the stem 2020 of each semiconductor laser device is bonded to the holding members 2030 and 2031 by the adhesive member 2040. As shown, by interposing the adhesive member 2040, adhesion between the semiconductor laser devices 2010 and 2011 and the holding members 2030 and 2031 can be increased and heat generated from the semiconductor laser devices 2010 and 2011 can be efficiently conducted to the holding members 2030 and 2031, and radiation performances of the semiconductor laser devices 2010 and 2011 can be improved. Furthermore, in addition to the lower face 2025 of the base portion of the stem of each semiconductor laser device, a side face 2026 of each semiconductor laser device is also bonded to the holding members 2030 and 2031 by the adhesive member 2040. Accordingly, heat generated from the semiconductor laser devices 2010 and 2011 can be efficiently conducted by the holding members 2030 and 2031 via the adhesive member 2040, and radiation performances of the semiconductor laser devices 2010 and 2011 can be further improved. In addition, an upper face 2024 of the base portion of the stem of the semiconductor laser device 2011 may be bonded to the second radiating member 2051 by the adhesive member 2040. Accordingly, the base portion 2023 of the stem of the semiconductor laser device 2011 is sandwiched between the second holding member 2031 and the second radiating member 2051 and is bonded to both members. Therefore, heat generated from the semiconductor laser device 2011 can be even more efficiently conducted by the second radiating member 2051 via the adhesive member 2040, and a radiation performance of the semiconductor laser device 2011 can be further improved.

Moreover, as described above, the semiconductor laser devices 2010 and 2011 can be strongly bonded to the holding members 2030 and 2031 by the adhesive member 2040 to make removal of the semiconductor laser devices 2010 and 2011 difficult. As a result, removal and use of the semiconductor laser devices 2010 and 2011 in another light source apparatus can be prevented. In addition, with the stem, a dent may be provided on a lower face and/or a side face of the base portion and an adhesive member may be provided so as to penetrate into the dent. Due to an anchor effect of the adhesive member penetrating into the dent of the stem, a semiconductor laser device can be more strongly bonded to a holding member. As a result, removal of the semiconductor laser device can be made more difficult.

As shown in FIGS. 8A and 8B, the second holding member 2031 has the third semiconductor laser device 2012 such that the stem 2020 of the third semiconductor laser device 2012 overlaps a part of the stem 2020 of the first semiconductor laser device 2010 when viewed from a light-emitting side. Therefore, the plurality of semiconductor laser devices 2010, 2011, and 2012 can be more densely arranged in the lateral direction and further downsizing of the light source apparatus can be readily achieved. In addition, the first holding member 2030 has the fourth semiconductor laser device 2013 such that the stem 2020 of the fourth semiconductor laser device 2013 overlaps a part of the stem 2020 of the second semiconductor laser device 2011 when viewed from a light-emitting side. Therefore, the plurality of semiconductor laser devices 2010, 2011, 2012, and 2013 can be more densely arranged in the lateral direction and further downsizing of the light source apparatus can be readily achieved. Furthermore, in order to equalize radiation performance, the semiconductor laser devices are preferably arranged regularly. For example, the semiconductor laser devices may be arranged at grid points with approximately equal intervals or in a radial pattern when viewed from a light-emitting side. Specifically, as illustrated, semiconductor laser devices held by the first holding member 2030 and semiconductor laser devices held by the second holding member 2031 may be alternately arranged both vertically and horizontally when viewed from a light-emitting side.

In addition, as shown in FIGS. 7A and 7B and FIGS. 8A and 8B, the semiconductor laser devices 2010 and 2011 comprise an optical component 2027 into which light from the semiconductor laser element 2015 enters and a cap 2028 which holds the optical component 2027 and which seals the semiconductor laser element 2015. By enhancing radiation performances of such semiconductor laser devices 2010 and 2011, a relative positional relationship between the semiconductor laser element 2015 and the optical component 2027 can be maintained and superior optical performance can be readily produced. In particular, due to the semiconductor laser devices 2010 and 2011 including a collimator lens or, in other words, due to the optical component 2027 being or including a collimator lens, parallel light can be emitted. As a result, installation positions of the semiconductor laser devices 2010 and 2011 in the optical axis direction can be modified while hardly affecting the optical performance of the light source apparatus 2100 and an arrangement which provides the semiconductor laser devices 2010 and 2011 with superior radiation performance can be more readily adopted.

<Third Embodiment>

Figure 9A:
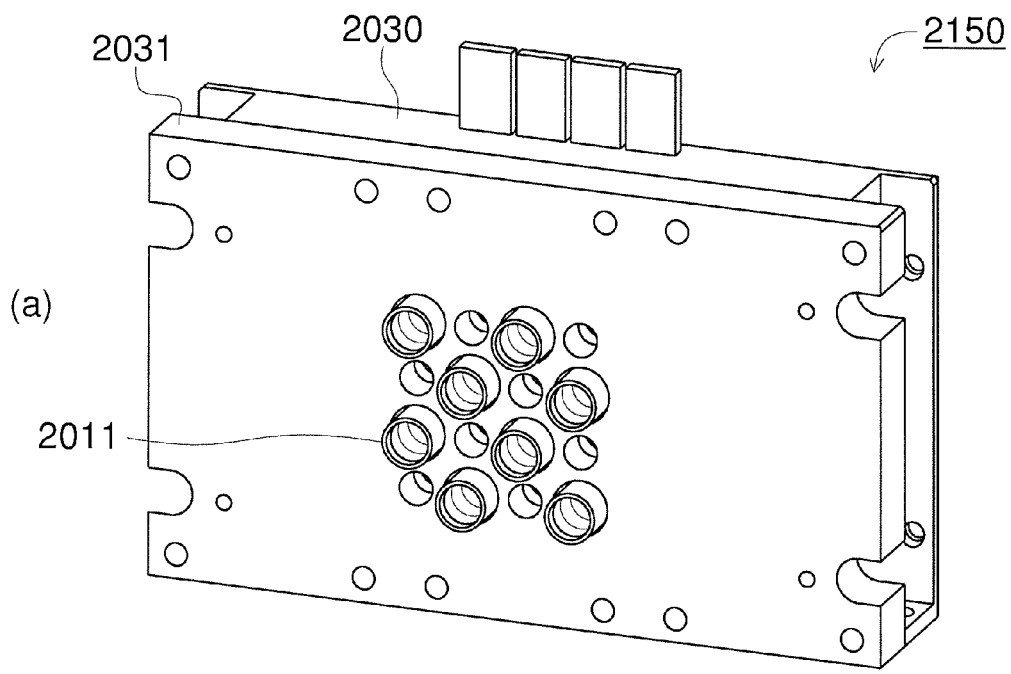
FIG. 9A is a schematic perspective view showing an exterior of a light source apparatus according to a third embodiment of the present invention.
Figure 9B:
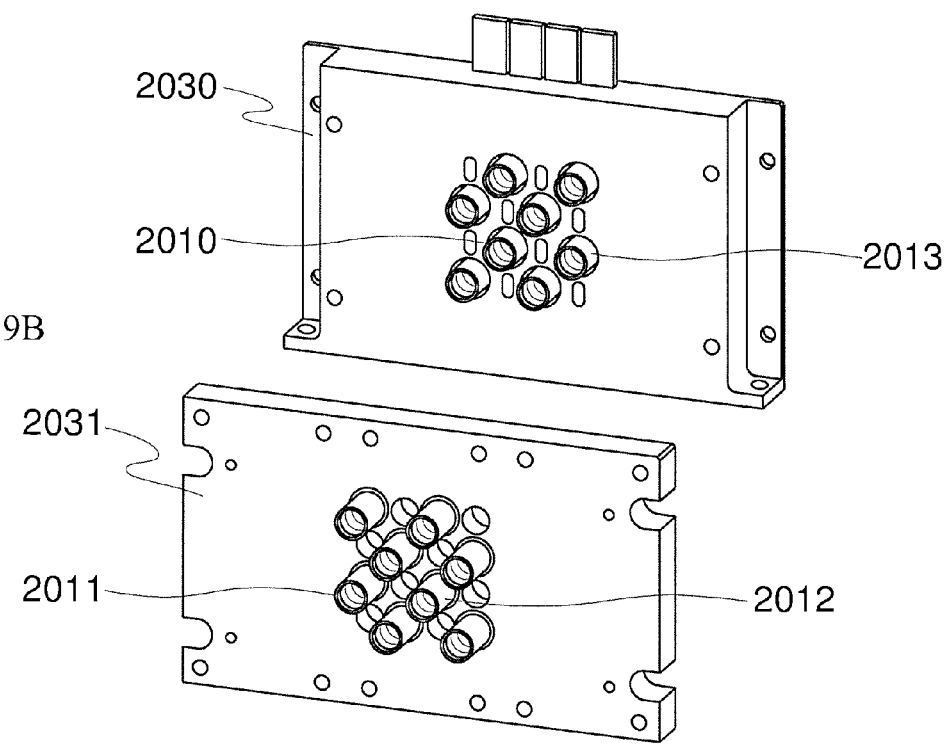
FIG. 9B is a schematic perspective view showing a construction of the light source apparatus.

FIG. 9A is a schematic perspective view showing an exterior of a light source apparatus according to a third embodiment of the present invention, and FIG. 9B is a schematic perspective view showing a construction of the light source apparatus. As shown in FIGS. 9A and 9B, a light source apparatus 2150 according to the third embodiment shares substantially the same construction as the light source apparatus 2100 according to the second embodiment with the exception of the light source apparatus 2150 not comprising the radiating members 2050 and 2051. As is with the light source apparatus 2150, the radiating members 2050 and 2051 may be omitted to realize a smaller light source apparatus. In this case, a rear face (a lower face) of a first holding member 2030 and a front face (an upper face) of a second holding member 2031 respectively constitute outer faces of the light source apparatus 2150. Therefore, other radiating members can be directly connected by providing a screw hole or the like on the rear face-side of the first holding member 2030 or the front face-side of the second holding member 2031.

The semiconductor laser devices according to the second and third embodiments of the present invention described above enable downsizing of a light source apparatus to be achieved while securing a high radiation performance of each semiconductor laser device.

In other words, recently, a light source apparatus in which a plurality of blue light-emitting semiconductor laser devices are arranged in a matrix pattern is used as a light source for a projector or the like (for example, refer to Japanese Patent Application Laid-open No. 2012-8549).

However, when a plurality of semiconductor laser devices is densely arranged on a same plane as described in Japanese Patent Application Laid-open No. 2012-8549, heat generated from the respective semiconductor laser devices tends to accumulate and is likely to cause a decline in light output or a deterioration in optical performance. On the other hand, arranging the semiconductor laser devices at greater intervals as a remedial measure to such problems results in increasing the size of the light source apparatus or an optical system installed in front of the light source apparatus.

The semiconductor laser devices according to the second and third embodiments of the present invention have been devised in consideration of such circumstances, and an object thereof is to provide a light source apparatus which is relatively small and which provides superior radiation performance with respect to each of a plurality of semiconductor laser devices while holding the plurality of semiconductor laser devices.

Hereinafter, each component will be described.

(Semiconductor Laser Element 2015)

The semiconductor laser element may include an element structure constituted by various semiconductors. In particular, since a laser element using a nitride semiconductor (typically expressed by the general formula $In_xAl_yGa_{1-x-y}N$ ($0 \leq x \leq 1$, $0 \leq y \leq 1$, $x+y \leq 1$)) capable of emitting ultraviolet light or short-wavelength visible light has superior directionality but is relatively susceptible to accumulation heat, a laser element using a nitride semiconductor is particularly suitable for the present invention. Moreover, in a case of a light source apparatus comprising a plurality of semiconductor laser elements (or semiconductor laser devices), emission wavelengths (emission colors) of the respective semiconductor laser elements (or the respective semiconductor laser devices) may be approximately the same or may differ among one another such as red, green, and blue.

(Stem 2020)

The stem is a member to which the semiconductor laser element is bonded. From the perspective of thermal conductivity, an element mounting portion and a base portion of the stem is preferably composed mostly of a metal such as copper, steel (carbon steel or the like), aluminum, gold, or an alloy thereof with the exception of a region which electrically insulates a terminal. In addition, the stem is preferably plated such that an outermost surface thereof is composed of gold. A stem in which a shape of a base portion in a top view approximately conforms to a circle or a stem having a part of the base portion cut off (known as an "I-cut stem" or a "D-cut stem") can be used. In addition, while the terminal is typically a rod-like lead terminal, the terminal may alternatively be a film-like or column-like electrode formed via a through hole, a via hole, or the like of the base portion.

(Optical Component 2027)

For the optical component, an optical element such as a lens, a mirror, a prism, an optical filter, a diffuser plate, or a cover glass, a wavelength converting member in which a fluorescent substance is combined with such an optical element or with a translucent member, an optical crystal such as a laser rod or a wavelength-converting non-linear optical crystal, an optical fiber, or the like can be used individually or in combination with each other. Moreover, the optical component is abutted against a positioning protrusion provided on an inner face of a cap and is fixed to the cap by application of an adhesive member (a second adhesive member), thermal compression bonding, press fitting, or the like.

For the fluorescent substance, yttrium aluminum garnet (YAG) activated by cerium, nitrogen-containing calcium-aluminosilicate ($CaO-Al_2O_3-SiO_2$) activated by europium and/or chromium, silicate ($(Sr,Ba)_2SiO_4$) activated by europium, or the like can be used. For example, a light source apparatus that emits white light can be realized by a combination of a semiconductor laser element emitting blue light and a fluorescent substance which absorbs a part of the blue light and emits yellow light.

(Cap 2028)

While the cap is a member which is connected to the base portion of the stem and which holds an optical component while sealing and protecting a semiconductor laser element, the cap can be omitted depending on a construction and an application of the light source apparatus. The cap need only be constructed so as to be capable of transmitting light emitted from the optical component in an optical axis direction. The cap may be made of a similar material to the holding member (to be described later). The cap is favorably shaped like a cylinder or a box. In a top view, preferably, the shape of the cap exposes a peripheral portion of an upper face of the base portion of the stem and approximately conforms to the shape of the base portion of the stem.

(Holding Members 2030 and 2031)

The holding member is a member which holds semiconductor laser devices. The holding member may assume various shapes including a plate-shape, a block-shape, a box-shape, a cylindrical shape, an L-shape, and a T-shape. As a base material of the holding member, aluminum, an aluminum alloy, copper, a copper alloy, stainless steel (austenitic stainless steel, ferritic stainless steel, or martensitic stainless steel), steel (SC steel or rolled steel for general structure), Super Invar, kovar, and the like can be used. In particular, aluminum or an aluminum alloy is favorable as the holding member due to superior thermal conductivity. Copper or a copper alloy is next favorable. When aluminum, an aluminum alloy, or steel is used as the base material of the holding member, plating is favorably applied to a surface of the holding member which comes into contact with an adhesive member in order to improve bondability with the adhesive member. The plating may be composed of a monolayer film or a multilayer film of gold, tin, nickel, silver, palladium, copper, and the like. In particular, favorably, from a perspective of bondability, at least an outermost surface contains tin or silver. In addition, a ceramic such as aluminum oxide, aluminum nitride, and silicon carbide can be used. Furthermore, a resin material such as a polycarbonate resin, an acrylic resin, a polyamide resin, an epoxy resin, ABS, ASA, and PBT can be used, or a material obtained by adding a filler such as magnesium oxide, aluminum oxide, aluminum nitride, silicon carbide, graphite, and titanium oxide to these resin materials may also be used. Moreover, a holding member with fins formed on an outer face thereof may be used.

(Adhesive Member 2040)

The adhesive member is a member which bonds a semiconductor laser device to a holding member. By heating the adhesive member with a heating device or the like to soften the adhesive member and subsequently cooling and solidifying the adhesive member (hereinafter, may also be referred to as "softening/solidifying"), a semiconductor laser device can be bonded to a holding member. The adhesive member may have a solid form or a paste form prior to softening. The adhesive member favorably contains metal. Examples include gold, tin, silver, bismuth, copper, indium, and antimony. Furthermore, while the adhesive member may contain a resin or an organic solvent at least prior to softening, favorably, the adhesive member is mainly composed of the metal described above after softening/solidifying. Specific examples include various solders or metallic pastes such as tin-bismuth based, tin-copper based, tin-silver based, and gold-tin based solders or metallic pastes. In addition, a resin to which a filler such as magnesium oxide, aluminum oxide, aluminum nitride, silicon carbide, and graphite is added may be used. Once the adhesive member is heated and softens/solidifies, a softening point (a softening temperature) of the adhesive member is favorably higher than that prior to softening. In particular, a difference between softening points is favorably equal to or greater than 30° C., more favorably equal to or greater than 50° C., and even more favorably equal to or greater than 100° C. Examples of such an adhesive member (prior to softening) include a copper powder-added tin-based solder (for example, the RAM series manufactured by Senju Metal Industry Co., Ltd.) and a sintered paste containing silver particles and an organic solvent such as alcohol (which mainly becomes a porous sintered compact of silver particles after solidification; for example, refer to WO2009/090915). Moreover, the term "softening" as used herein can be defined as an occurrence of liquefaction or a decline in viscosity due to melting, glass transition, or the like of a component regardless of the adhesive member having a solid form or a paste form prior to such softening. A melting point can be adopted as the softening point depending on a component of the adhesive member.

(Radiating Members 2050 and 2051)

The radiating member is a member which is connected to a holding member and which is capable of promoting radiation of heat from the holding member and, by extension, from a semiconductor laser device. The radiating member is a radiator or a heat sink and favorably has fins in order to radiate heat effectively. Possible fin shapes include a plate-shape, a needle-point holder shape, a cylindrical shape, and a spiral shape. The radiating member may be made of a similar material to the holding member (described earlier). Moreover, the radiating member is capable of radiating heat even more effectively when a fan is provided near the radiating member. The radiating member is not an essential component and can be omitted.

While the first to third embodiments of the present invention have been described above, it is to be understood that all of these embodiments are based on the technical ideas of the present invention. Accordingly, components such as a "holding member" or a "semiconductor laser device" in one embodiment are related to their counterparts in the other embodiments.

[First Example]

Next, a light source apparatus according to a first example of the present invention will be described.

The light source apparatus according to the first example of the present invention is the construction of the light source apparatus 1011 according to the first embodiment of the present invention specifically identified as described below. Moreover, it is assumed that optical axis directions of the plurality of semiconductor laser devices 1013 are parallel to one another. A=20 mm, B=8 mm, and F=5 mm, where A denotes a relative position in the optical axis direction of adjacent semiconductor laser devices 1013 in a front view of the holding member 1015, B denotes a relative position in a direction perpendicular to the optical axis direction of two adjacent semiconductor laser devices 1013 in a front view of the holding member 1015, and F denotes a focal length of the collimator lens 1025.

In the light source apparatus according to the first example of the present invention, the relative position in the optical axis direction of two adjacent semiconductor laser devices 1013 in a front view of the holding member 1015 is equal to or greater than twice the relative position in a direction perpendicular to the optical axis direction of the two adjacent semiconductor laser devices 1013 in a front view of the holding member 1015.

Therefore, with the light source apparatus according to the first example of the present invention, since the plurality of semiconductor laser devices is densely arranged in a direction perpendicular to a direction in which light is emitted from the light source apparatus but sparsely arranged in the direction in which light is emitted from the light source apparatus, heat created at the semiconductor laser devices can be efficiently released to the outside. As a result, a light source apparatus can be provided which uses a plurality of semiconductor laser devices and offers adequate heat dissipation and which is capable of enduring use in a picture-irradiating device such as a projector. In addition, the light source apparatus can be downsized (a width (a lateral width) of the light source apparatus in the direction perpendicular to the direction in which light is emitted from the light source apparatus can be reduced). Furthermore, since a plane area of light emitted from the light source apparatus can be reduced, subsequent light control such as condensing can be performed more easily.

[Second Example]

A light source apparatus according to a second example is a projector light source having a construction of an example shown in FIGS. 5 and 6 and is constructed as described below.

The light source apparatus according to the second example comprises two holding members (LD holders) which overlap each other and which are fixed by screws. For each of the two holding members, tin plating is applied to an outer face of an aluminum alloy-base material.

A rear holding member is an approximately plate-like member with a thickness of 12.5 mm and having eight holes, each hole being a pair composed of a depression with a circular opening of 9.1 mm in diameter and a depth of 7 mm and a through hole which is provided on a bottom face of the depression and which has an elliptical opening through which a lead terminal is passed. The holes are arranged in four rows by four columns at a center-to-center spacing of 15 mm between two holes in each row, intervals between rows is 7.5 mm, hole arrangements are the same in odd-numbered rows and even-numbered rows, and holes on odd-numbered rows are displaced by 7.5 mm with respect to holes on even-numbered rows. In addition, the rear holding member has eight elliptical through holes through which conductor wires to be connected to lead terminals of semiconductor laser devices held by a front holding member are passed. Moreover, the rear holding member holds a circuit board which is electrically connected to the lead terminals of the respective semiconductor laser devices such that the circuit board extends out in a lateral direction.

The front holding member is an approximately plate-like member with a thickness of 8.5 mm and having eight holes, each hole being a pair composed of a depression with a circular opening of 9.1 mm in diameter and a depth of 2 mm and a through hole which is provided on a bottom face of the depression and which has an elliptical opening through which a lead terminal is passed. The holes are arranged in four rows by four columns so as to alternate with the holes of the rear holding member. In addition, the front holding member has eight through holes (window portions) with circular openings through which parts of caps of semiconductor laser devices held by the rear holding member are inserted and which transmit light from the semiconductor laser devices. The through holes comprise a narrow width portion on the front-side (upper-side) with diameter of 5.3 mm and a length (depth) of 3.5 mm and a wide width portion on the rear-side (lower-side) with diameter of 7.5 mm.

The semiconductor laser device is constructed such that a semiconductor laser element is mounted on a stem and a cap holding an optical component is fixed to the stem. The stem has a block-like element mounting portion, two lead terminals, and a disk-like base portion with a diameter of 9 mm and a thickness of 1.5 mm, the element mounting portion, the lead terminals, and the base portion all having gold plating applied on a surface of a copper-alloy base material. A nitride semiconductor laser element with a central emission wavelength of 455 nm and a rated output of 3 W is bonded to the element mounting portion of the stem via a submount. The cap is a cylindrical member made of stainless steel and having a diameter of 6.85 mm, and a flange-shaped portion at a lower end of the cap is welded to an upper face of the base portion of the stem. An optical component that is a collimator lens with an NA of 0.5 and made of BK7 is fixed to an upper part of the cap by press fitting. Moreover, a dent (notch) that is approximately triangular in a top view is provided on a side face of the base portion of the stem so as to penetrate from the upper face to the lower face of the base portion.

In addition, the base portion of the stem of the semiconductor laser device described above is housed in each depression of the two holding members, and the lower face and the side face of the base portion of the semiconductor laser device are bonded with the respectively opposing bottom and side faces of the depression by an interposed adhesive member. Furthermore, the adhesive member also penetrates into the dent on the side face of the base portion of the stem. Moreover, the adhesive member is a tin-bismuth based solder.

Two radiating members are provided so as to sandwich, from front and rear, the two holding members that overlap each other. The two radiating members are respectively heat sinks which are made of an aluminum alloy and which are provided with an array of plate-like fins protruding outward, and are fixed to the holding members by screws. Moreover, a center portion of the front radiating member is free of fins and is provided instead with 16 through holes having circular openings for emitting light from the respective semiconductor laser devices to the outside of the apparatus. In addition, parts of caps of the semiconductor laser devices held by the front holding member are inserted into half of the through holes.

With a light source apparatus constructed as described above, even when the light source apparatus is driven for a long period of time, a temperature rise of semiconductor laser devices can be suppressed and stable optical performance such as light output and optical axes can be maintained.

(Addition)

The present invention has the following addition.

A light source apparatus comprising: a first holding member which holds a first semiconductor laser device having a stem; and a second holding member which holds a second semiconductor laser device having a stem and which is provided on top of the first holding member, wherein the second holding member has a window portion through which light from the first semiconductor laser device is emitted, and the second holding member holds the second semiconductor laser device such that the stem of the second semiconductor laser device overlaps apart of the stem of the first semiconductor laser device when viewed from a light emitting-side.

In the light source apparatus according to the addition, preferably, the first holding member and the second holding member comprise depressions, and at least a part of the stem of the first semiconductor laser device and at least a part of the stem of the second semiconductor laser device are housed in the depressions.

In the light source apparatus according to the addition, preferably, at least apart of the first semiconductor laser device is inserted into the window portion of the second holding member.

In the light source apparatus according to the addition, preferably, the window portion of the second holding member includes a narrow width portion whose width is narrower than a width of the first semiconductor laser device.

Preferably, the light source apparatus according to the addition further comprises a radiating member which has a window portion and which is connected to the second holding member, and at least a part of the second semiconductor laser device is inserted into the window portion of the radiating member.

In the light source apparatus according to the addition, preferably, the second holding member holds a third semiconductor laser device having a stem such that the third semiconductor laser device is separated from the second semiconductor laser device and, at the same time, the stem of the third semiconductor laser device overlaps apart of the stem of the first semiconductor laser device when viewed from the light emitting-side.

In the light source apparatus according to the addition, preferably, the stem has an element mounting portion on which a semiconductor laser element is mounted, a terminal to be electrically connected to the semiconductor laser element, and a base portion which holds the element mounting portion on an upper face-side of the base portion and which holds the terminal by exposing the terminal on a lower face-side of the base portion, and the lower face of the base portion of the stem of the semiconductor laser device is bonded to the holding member by an adhesive member.

In the light source apparatus according to the addition, preferably, the semiconductor laser device includes a collimator lens.

The light source apparatus according to the present invention can be suitably used as light sources of a projector, a laser beam machine, an optical recording/playback device, a display, a printer, an optical communication device, and the like, and as light sources of various lighting such as a head light of an automobile.

While embodiments and examples of the present invention have been described above, the foregoing relates to only one example of the present invention and it is to be understood that the present invention is not limited to the description in any way.

DENOTATION OF REFERENCE NUMERALS

1011 . . . light source apparatus
1013 . . . semiconductor laser device
1131 . . . semiconductor laser device
1132 . . . semiconductor laser device
1015 . . . holding member
1017 . . . stem 1019 . . . semiconductor laser element
1021 . . . cap
1023 . . . lead pin
1025 . . . collimator lens
1027 . . . depression
1029 . . . through hole
1031 . . . radiating member
1033 . . . through hole
1035 . . . groove
1037 . . . flexible cable
2010, 2011, 2012, 2013 . . . semiconductor laser device (2010 . . . first semiconductor laser device, 2011 . . . second semiconductor laser device, 2012 . . . third semiconductor laser device, 2013 . . . fourth semiconductor laser device)
2015 . . . semiconductor laser element
2020 . . . stem (2021 . . . element mounting portion, 2022 . . . terminal, 2023 . . . base portion (2024 . . . upper face, 2025 . . . lower face, 2026 . . . side face)
2027 . . . optical component
2028 . . . cap)
2030, 2031 . . . holding member (2030 . . . first holding member, 2031 . . . second holding member, 2033 . . . window portion (2037 . . . narrow width portion), 2035 . . . depression) 2040 . . . adhesive member
2050, 2051 . . . radiating member (2050 . . . first radiating member, 2051 . . . second radiating member (2053 . . . window portion))
2100, 2150 . . . light source apparatus

What is claimed is:

1. A light source apparatus comprising:
a plurality of semiconductor laser devices; and
a holding member on which the plurality of semiconductor laser devices are disposed,
wherein at least one semiconductor laser device among the plurality of semiconductor laser devices is disposed on the holding member such that a relative position of the semiconductor laser device in an optical axis direction with respect to an adjacent semiconductor laser device in a front view of the holding member is greater than a relative position of the semiconductor laser device in a direction perpendicular to the optical axis direction with respect to the adjacent semiconductor laser device,
wherein depressions are located on a front face and a rear face of the holding member, respectively, and
wherein each of the semiconductor laser devices is disposed in a respective one of the depressions.

2. The light source apparatus according to claim 1, wherein the semiconductor laser devices are collimator lens-integrated semiconductor laser devices.

3. The light source apparatus according to claim 1, wherein at least one of the depressions is formed such that an inner diameter thereof corresponds to an outer diameter of a semiconductor laser device disposed therein.

4. The light source apparatus according to claim 1, wherein at least one of the depressions is formed such that a depth thereof corresponds to a thickness of a semiconductor laser device disposed therein.

5. The light source apparatus according to claim 1, wherein a radiating member is attached to at least one of the front face and the rear face of the holding member.

6. The light source apparatus according to claim 5, wherein:
at least one of the semiconductor laser devices has a stem, and
the radiating member abuts the stem of said at least one semiconductor laser device.

7. The light source apparatus according to claim 6, wherein said at least one semiconductor laser device is held by the holding member due to the stem being pressed down by the radiating member.

8. The light source apparatus according to claim 5, wherein the radiating member has a plurality of fins.

9. The light source apparatus according to claim 8, wherein:
a through hole is provided in the radiating member attached to the front face of the holding member, and
light emitted from the semiconductor laser device passes through the through hole.

10. The light source apparatus according to claim 9, wherein radiating members are respectively attached to the front face and the rear face of the holding member.

11. The light source apparatus according to claim 9, wherein each semiconductor laser device comprises a semiconductor laser element that includes a nitride semiconductor.

* * * * *